United States Patent [19]
Kirihara

[11] Patent Number: 6,103,572
[45] Date of Patent: Aug. 15, 2000

[54] METHOD OF FABRICATING A SEMICONDUCTOR NONVOLATILE STORAGE DEVICE

[75] Inventor: Makoto Kirihara, Saitama, Japan

[73] Assignee: Citizen Watch Co., Ltd., Tokyo, Japan

[21] Appl. No.: 09/019,101

[22] Filed: Feb. 5, 1998

[30] Foreign Application Priority Data

Feb. 7, 1997 [JP] Japan .................................. 9-024586

[51] Int. Cl.$^7$ ................................................ H01L 21/336
[52] U.S. Cl. ......................... 438/257; 438/26.1; 438/263
[58] Field of Search ................................... 257/184, 316; 438/257, 261, 302, 238, 591, 263

[56] References Cited

U.S. PATENT DOCUMENTS

| | | | |
|---|---|---|---|
| 4,538,344 | 9/1985 | Okumura et al. | 29/589 |
| 5,464,793 | 11/1995 | Roehl | 437/186 |
| 5,534,460 | 7/1996 | Tseng et al. | 437/187 |
| 5,652,156 | 7/1997 | Liao et al. | 437/40 |
| 5,804,470 | 9/1998 | Wollesen | 438/141 |

*Primary Examiner*—John F. Niebling
*Assistant Examiner*—Walter L. Lindsay, Jr.
*Attorney, Agent, or Firm*—Armstrong, Westerman, Hattori, McLeland & Naugthon

[57] ABSTRACT

The method of fabricating a semiconductor nonvolatile storage device of this invention includes the steps of: forming an element region and an element isolation region on a semiconductor substrate; forming a memory gate insulation film by sequentially layering a tunnel oxide film, a silicon nitride film and a top oxide film on the device region; forming a memory gate electrode on the memory gate insulation film; forming heavily doped diffusion regions at element region portions self-aligned on opposite sides of the memory gate electrode; forming an interlayer insulator over the whole surface of the semiconductor substrate; forming contact holes in the interlayer insulator; forming interconnections passing through the contact holes and connecting with the memory gate electrode and the heavily doped diffusion regions; forming a passivating film over the whole surface of the semiconductor substrate including the interconnections by the plasma chemical vapor deposition process; forming openings for input/output terminals in the passivating film at positions thereof corresponding to the memory gate electrode and the heavily doped diffusion regions by plasma etching; and annealing the passivating film.

17 Claims, 8 Drawing Sheets

METHOD OF FABRICATING A SEMICONDUCTOR NONVOLATILE STORAGE DEVICE

BACKGROUND OF THE INVENTION

1. Field of the Invention

This invention relates to a method of fabricating a semiconductor nonvolatile storage device (nonvolatile memory), more particularly a method of fabricating a semiconductor nonvolatile storage device of metal—oxide film—nitride film—oxide film—semiconductor (MONOS) structure.

2. Description of the Related Art

Semiconductor nonvolatile storage devices that enable electrical rewriting of data are referred to generally as EEPROMs. Various types are known. The main ones are the MONOS memory, the MNOS memory and the floating gate memory.

The MONOS memory is a semiconductor nonvolatile storage device having a metal—oxide film—nitride film—oxide film—semiconductor (MONOS) structure. It has attracted attention owing to its high reliability and its ability to permit any number of data rewrites.

The structure of the semiconductor nonvolatile storage device having the MONOS structure and the conventional method of fabricating it will be explained with reference to FIGS. 23 to 25.

To fabricate a semiconductor nonvolatile storage device of the MONOS structure, an element isolation region 15 composed of a silicon nitride film is formed on a semiconductor substrate 14 of P-conductivity-type silicon, as shown in FIG. 23.

A silicon oxide film for providing a tunnel oxide film 1 is then formed over the whole surface of the semiconductor substrate 14 by thermal oxidation.

Next, a silicon nitride film is formed over the whole surface of the semiconductor substrate 14 by the chemical vapor deposition (CVD) process. This silicon nitride film is subjected to thermal oxidation to form a silicon oxide film for providing a top oxide film 3.

After this, a polycrystalline silicon film for providing a memory gate electrode 4 is formed over the whole surface of the semiconductor substrate 14 by the chemical vapor deposition process.

A patterned photo resist (not shown) is then formed. The patterned photo resist is used as an etching mask to sequentially etch the polycrystalline silicon film, the silicon oxide film, the silicon nitride film and the silicon oxide film to pattern the memory gate electrode 4 and a memory gate insulating film 20 composed of the top oxide film 3, a silicon nitride film 2 and the tunnel oxide film 1, as shown in FIG. 23. The photo resist used as the etching mask is thereafter removed.

The tunnel oxide film 1 is an insulating film for injecting or emitting electrons or holes. The silicon nitride film 2 is an insulating film whose function is to trap electrons or holes injected through the tunnel oxide film 1. The function of the top oxide film 3 is to block injection of electrons or holes from the memory gate electrode 4 when the semiconductor nonvolatile storage device effects write or erase operation.

Next, high-concentration diffused regions 5, 5 are formed by implanting phosphorus ions into the element region of the semiconductor substrate 14 at prescribed portions thereof self-aligned with opposite sides of the memory gate electrode 4 and the device isolation region 15.

As shown in FIG. 24, an interlayer insulator 6 composed of a silicon oxide film is then formed over the whole surface of the semiconductor substrate 14 by the chemical vapor deposition (CVD) process.

A patterned photo resist (not shown) is then formed. The patterned photo resist is used as an etching mask to form contact holes 7 in the interlayer insulator 6 by etching. The photo resist used as the etching mask is thereafter removed.

Next, an interconnection material composed of aluminum is formed over the whole surface of the semiconductor substrate 14, including the insides of the contact holes 7, by sputtering.

A patterned photo resist (not shown) is then formed and the interconnection material is plasma-etched using the patterned photo resist as a mask to form a gate interconnection electrode 8G, a source interconnection electrode 8S and a drain interconnection electrode 8D that make contact through the contact holes 7 with the exposed portions of the memory gate electrode 4 and the heavily doped diffusion regions 5, 5.

Following this, the photo resist used as the etching mask is removed and the interconnection electrodes are annealed in a hydrogen atmosphere to lower the contact resistance between the source interconnecting electrodes 8S, 8D and the heavily doped diffusion regions 5.

Next, as shown in FIG. 25, the whole surface of the semiconductor substrate 14 is formed with a passivating film 10 composed of a silicon nitride film by the plasma chemical vapor deposition (CVD) process.

Openings 10a are thereafter phot-etched in the passivating film 10 to expose the interconnection electrodes 8G, 8S and 8D at input/output terminal portions 11 for enabling connection with an external device.

Although FIG. 25 shows only the input/output terminal portion 11 of the source interconnection electrode 8S and the associated opening 10a, an input/output terminal portion and an associated opening are also formed at a different sectional portion from that shown in FIG. 25 for each of the gate interconnection electrode 8G and the drain interconnection electrode 8D.

This step of forming the openings in the passivating film 10 completes the fabrication of the semiconductor nonvolatile storage device.

When this conventional method of fabricating a semiconductor nonvolatile storage device of MONOS structure is adopted, the semiconductor nonvolatile storage device is damaged in the step of etching the interconnection material, the step of forming the passivating film and/or the step of etching the passivating film.

This damage is caused by the step of plasma-etching the interconnection material, the plasma chemical vapor deposition process during passivating film formation, and the step of plasma-etching the passivating film.

Specifically the plasma separates the etching gas or the material for forming the passivating film into positive charges and negative charges and the positive charges or negative charges charge the memory gate electrode 4 during etching or passivating film formation. When the memory gate electrode 4 is positively charged, electrons from the semiconductor substrate 14 are trapped in the memory gate insulating film 20, and when it is negatively charge, holes from the semiconductor substrate 14 are trapped in the memory gate insulating film 20.

Such charging of the semiconductor nonvolatile storage device is equivalent to applying a write or erase voltage to the memory gate electrode 4, and has the same effect. Specifically, the electrons or holes trapped in the memory gate insulating film 20 change the threshold voltage of the semiconductor nonvolatile storage device.

This change in threshold voltage changes the threshold voltage during write and erase. Since this may prevent the semiconductor nonvolatile storage device from effecting normal write and erase, it is a cause of defective operation.

SUMMARY OF THE INVENTION

An object of this invention is to provide a method of fabricating a semiconductor nonvolatile storage device that does not change the threshold voltage of a semiconductor nonvolatile storage device of the type described in the foregoing during the fabrication steps.

To achieve this object, the method of fabricating a semiconductor nonvolatile storage device of this invention includes the steps of:

forming an element region and an element isolation region on a semiconductor substrate;

forming a memory gate insulation film by sequentially layering a tunnel oxide film, a silicon nitride film and a top oxide film on the device region of the semiconductor substrate;

forming a memory gate electrode on the memory gate insulation film;

forming heavily doped diffusion regions at element region portions of the semiconductor substrate self-aligned on opposite sides of the memory gate electrode;

forming an interlayer insulator over the whole surface of the semiconductor substrate including the memory gate electrode;

forming contact holes in the interlayer insulator at positions thereof corresponding to the memory gate electrode and the heavily doped diffusion regions;

forming interconnection electrodes passing through the contact holes and connecting with the memory gate electrode and the heavily doped diffusion regions;

forming a passivating film over the whole surface of the semiconductor substrate including the interconnection electrodes by a plasma chemical vapor deposition process;

forming openings for input/output terminals in the passivating film at positions thereof corresponding to the memory gate electrode and the heavily doped diffusion regions by plasma etching; and annealing the passivating film.

In this method of fabricating a semiconductor nonvolatile storage device, a step of annealing the interconnection electrodes is preferably included following the steps of forming interconnection electrodes, and the annealing the passivating film is preferably conducted at a higher temperature than the annealing temperature in the interconnection electrode annealing.

In this case, the interconnection electrodes are preferably annealed at about 380° C. in a hydrogen atmosphere in the interconnection electrode annealing step, and the passivating film is preferably annealed at about 425° C. in a nitrogen atmosphere in the passivating film annealing step.

In this passivating film annealing step, the annealing is preferably conducted at an upper limit temperature beyond which the interconnection electrodes melt, i.e., a temperature slightly lower than the melting point of the interconnection material.

In these steps for fabricating a semiconductor nonvolatile storage device, the high-temperature annealing conducted after formation of the passivating film discharges electrons or holes trapped in the memory gate insulation film during, for instance, formation of the passivating film and formation of the holes for the input/output terminals by plasma etching. The damage caused by these steps can therefore be remedied. A stable semiconductor nonvolatile storage device experiencing no change in threshold voltage can therefore be obtained.

In the foregoing method of fabricating a semiconductor nonvolatile storage device the following steps can be effected in place of the step of forming heavily doped diffusion regions at element region portions of the semiconductor substrate self-aligned on opposite sides of the memory gate electrode:

forming lightly doped diffusion regions at element region portions of the semiconductor substrate self-aligned on opposite sides of the memory gate electrode;

forming sidewall insulating films on opposite side surfaces of the memory gate electrode and the memory gate insulation film; and forming heavily doped diffusion regions in the lightly doped diffusion regions of the semiconductor substrate other than the portions covered by the sidewall insulating films of the opposite side surfaces.

In these methods of fabricating a semiconductor nonvolatile storage device, the memory gate insulation film can be formed in the step of forming the memory gate insulation film on the element region of the semiconductor substrate by sequentially layering a tunnel nitride-oxide film, a silicon nitride film and a top oxide film.

In the foregoing methods of fabricating a semiconductor nonvolatile storage device, the passivating film forming step can be effected by forming a first passivating film composed of a silicon oxide film containing phosphorus over the whole surface of the semiconductor substrate including the interconnection electrodes and forming a second passivating film composed of a silicon nitride film on the first passivating film.

In this case, in the step of forming openings for input/output terminals in the passivating film, openings are preferably formed whose inner surrounding surfaces of the first passivating film are coated with the second passivating film.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the method of fabricating a semiconductor nonvolatile storage device according to the invention will now be explained with reference to the drawings.

First embodiment: FIGS. 1 to 12

A method of fabricating a semiconductor nonvolatile storage device that is a first embodiment of the invention will now be explained with reference to FIGS. 1 to 12.

FIGS. 1 to 12 are schematic sectional views illustrating the method of fabricating a semiconductor nonvolatile storage device in the order of its steps.

Figure 1:
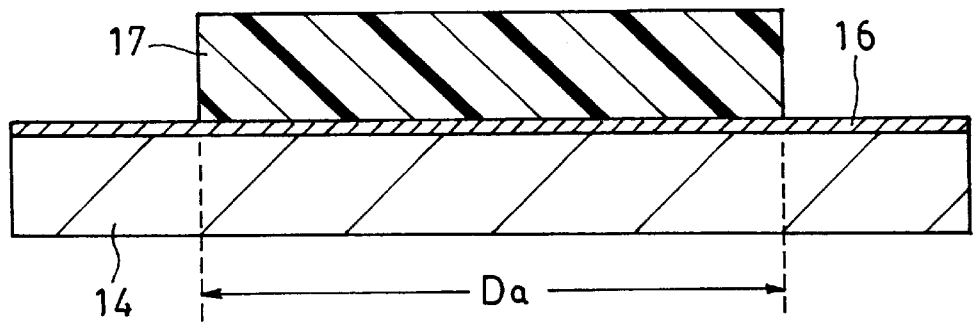
FIGS. 1 to 12 are schematic sectional views illustrating a method of fabricating a semiconductor nonvolatile storage device that is a first embodiment of the invention in the order of its steps.

First, as shown in FIG. 1, a silicon nitride film 16 is formed over the whole surface of a P-conductivity-type semiconductor (silicon) substrate 14 by the chemical vapor deposition process (CVD process) using dichlorosilane ($SiH_2Cl_2$) and ammonia ($NH_3$) as reaction gases. The silicon nitride film 16 is formed to a thickness of 150 nm.

A film of photosensitive resin 17 is then formed over the whole surface of the semiconductor substrate 14 by spin coating. The photosensitive resin 17 is exposed using a prescribed photomask and developed to pattern it to remain on an element region Da, as shown in FIG. 1.

Figure 2:
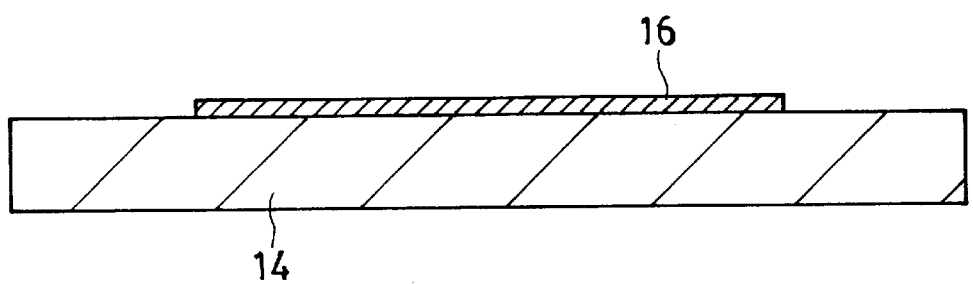

Next reactive ion etching using sulfur hexafluoride ($SF_6$), trifluoromethane ($CHF_3$) and helium (He) as reactive gases is effected using the patterned photosensitive resin as an etching mask to pattern the silicon nitride film 16 so as to remain only at the device region Da of the semiconductor substrate 14, as shown in FIG. 2.

The photosensitive resin used as the etching mask is then removed by immersion wet etching in 150° C. hot sulfuric acid.

Figure 3:
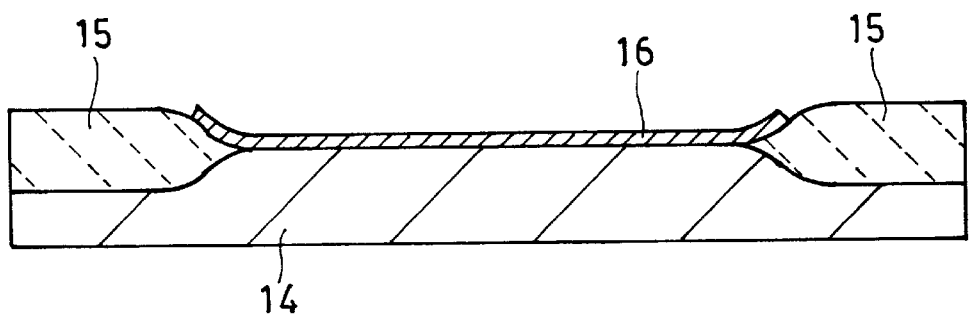

Following this, oxidation treatment is conducted at 1000° C. in an oxygen atmosphere containing steam to selectively form an element isolation region 15 composed of a 710 nm-thick silicon oxide film surrounding the element region Da of the semiconductor substrate 14, as shown in FIG. 3.

At this time, the silicon nitride film 16 functions as an oxidation-resistant film and the element isolation region 15 is formed at the region not formed with this silicon nitride film.

Figure 4:
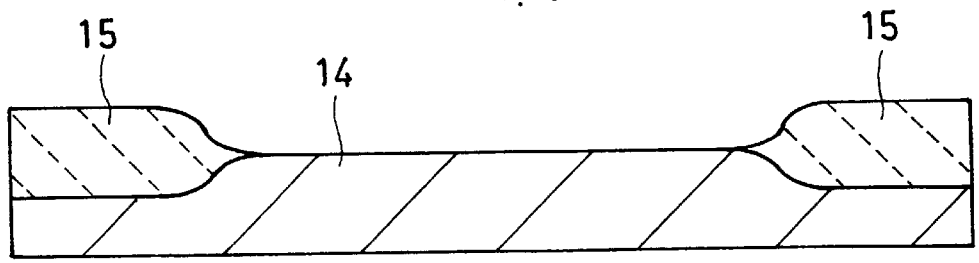

Next, the silicon nitride film 16 used as the oxidation-resistant film is removed using hot phosphoric acid heated to 180° C. The result is shown in FIG. 4. The region of the semiconductor substrate 14 not formed with the element isolation region 15 composed of a silicon oxide film is the element region.

Figure 5:
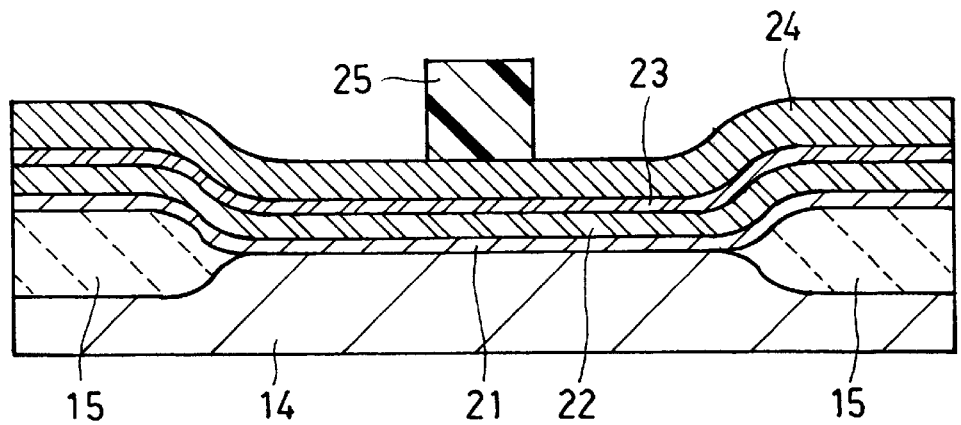

Then, as shown in FIG. 5, a silicon oxide film 21 for providing a tunnel oxide film is formed on the semiconductor substrate 14 to a thickness of 2.2 nm by conducting oxidation at 900° C. in an oxygen atmosphere.

A silicon nitride film 22 is thereafter formed on the silicon oxide film 21 to a thickness of 12 nm by the chemical vapor deposition process using dichlorosilane ($SiH_2Cl_2$) and ammonia ($NH_3$) as reaction gases.

Following this, the silicon nitride film 22 is subjected to oxidation treatment under conditions of a steam atmosphere and a temperature of 950° C. to form a 4.5 nm-thick silicon oxide film 23 for providing a top oxide film on the silicon nitride film 22.

A polycrystalline silicon film 24 for providing a memory gate electrode is then formed over the whole surface of the silicon oxide film 23 to a thickness of 450 nm by the chemical vapor deposition process using monosilane ($SiH_4$).

A film of photosensitive resin 25 is then formed over the whole surface of the polycrystalline silicon film 24 on the semiconductor substrate 14 by spin coating.

The photosensitive resin is exposed using a prescribed photomask and developed to pattern it to remain at the region where the memory gate electrode is to be formed, as shown in FIG. 5.

Figure 6:
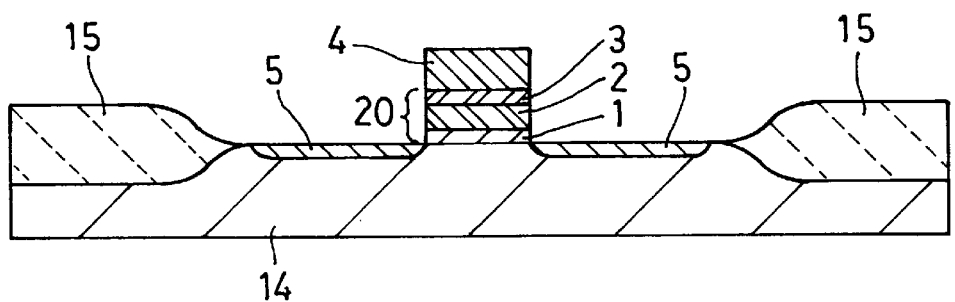

Next, reactive ion etching using sulfur hexafluoride ($SF_6$), chlorine ($Cl_2$) and difluoromethane ($CH_2F_2$) as reactive gases is effected using the photosensitive resin as an etching mask to etch the polycrystalline silicon film 24 and form the memory gate electrode 4 shown in FIG. 6 to a prescribed size at the central portion of the element region on the semiconductor substrate 14.

Following this, the silicon oxide film 23 is wet-etched using a mixed aqueous solution of hydrofluoric acid (HF) and ammonium fluoride ($NH_4F$) as etchant to pattern a top oxide film 3 as shown in FIG. 6.

Further, reactive ion etching using carbon tetrafluoride ($CF_4$), helium (He) and carbon trifluorobromide ($CBrF_3$) as reactive gases is effected to etch the silicon nitride film 22 and pattern a silicon nitride film 2 as shown in FIG. 6.

After this, the silicon oxide film 21 is wet-etched using a mixed aqueous solution of hydrofluoric acid (HF) and ammonium fluoride ($NH_4F$) as etchant to pattern a tunnel oxide film 1 as shown in FIG. 6. The photosensitive resin used as the etching masks is then removed using hot sulfuric acid heated to 150° C. By the foregoing, there is formed a three-layer memory gate insulating film 20.

The tunnel oxide film 1 is an insulating film whose function is to inject or emit electrons or holes. The silicon nitride film 2 is an insulating film whose function is to trap electrons or holes injected through the tunnel oxide film 1. The function of the top oxide film 3 is to block injection of electrons or holes from the memory gate electrode 4 when the semiconductor nonvolatile storage device effects write or erase operation.

Next, heavily doped diffusion regions 5, 5 are formed within the element region of the semiconductor substrate 14 at prescribed regions self-aligned with the opposite sides of the memory gate electrode 4 and the device isolation region 15 by implanting ions of phosphor, an impurity of N-type conductivity, under conditions of an acceleration energy of 50 keV and an ion implantation dose of $3.5 \times 10^{15}$ atoms/cm$^2$.

Figure 7:
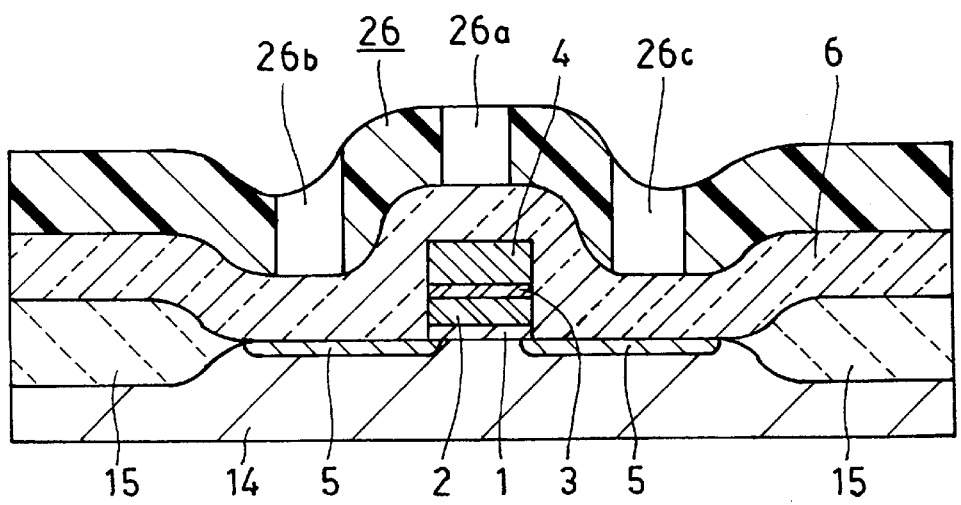

As shown in FIG. 7, an interlayer insulator 6 composed of BPSG, i.e., a silicon oxide film containing phosphorus (P) and boron (B), is formed over the whole surface of the semiconductor substrate 14 by the chemical vapor deposition process using monosilane ($SiH_4$), phosphine ($PH_3$) and diborane ($B_2H_6$) as reaction gases. The interlayer insulator 6 is formed to a thickness of 550 nm.

Further, annealing is conducted at a temperature of 900° C. for 30 minutes in a nitrogen atmosphere to effect so-called reflow by causing viscous flow of the BPSG interlayer insulator 6, thereby flattening the interlayer insulator 6.

At the same time that it flattens the interlayer insulator 6, this annealing also laterally diffuses the impurity of the heavily doped diffusion regions 5 to enable formation of the heavily doped diffusion regions 5 as far as regions beneath the memory gate electrode 4.

Next, a film of photosensitive resin 26 is formed over the whole surface of the interlayer insulator 6 on the semiconductor substrate 14 by spin coating. The photosensitive resin 26 is exposed using a prescribed photomask and developed to form openings 26a, 26b, 26c at portions of the photosensitive resin 26 where contact holes are to be formed, as shown in FIG. 7.

Figure 8:
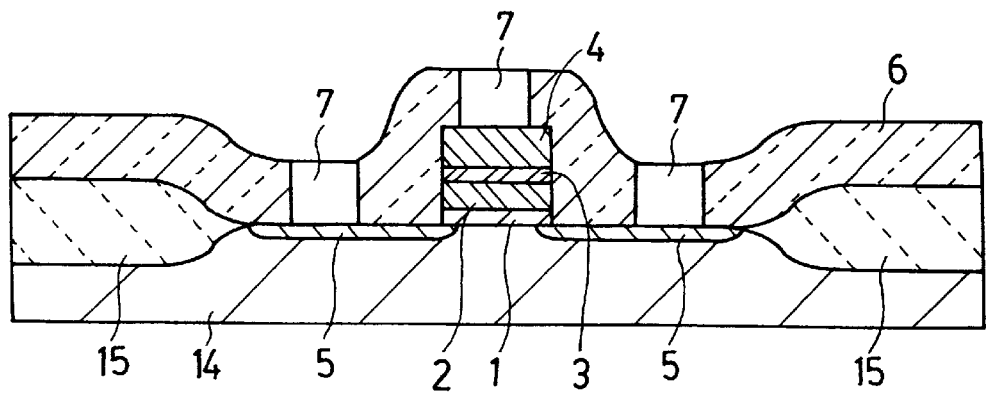

After this, reactive ion etching using difluoromethane ($CH_2F_2$) and trifluoromethane ($CHF_3$) as reactive gases is effected using the photosensitive resin 26 as an etching mask to open contact holes 7 in the interlayer insulator 6 at positions corresponding to the memory gate electrode 4 and the heavily doped diffusion regions 5, 5, as shown in FIG. 8.

The photosensitive resin used as the etching mask is then removed using hot sulfuric acid heated to 150° C.

Figure 9:
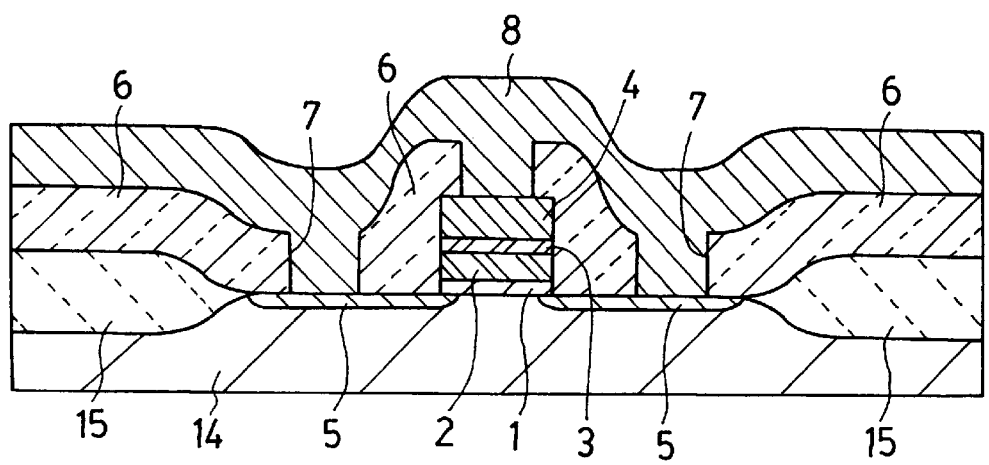

Next, as shown in FIG. 9, an interconnection material 8 composed of aluminum is formed on the interlayer insulator 6 to a thickness of 1 μm by sputtering. The interconnection material 8 is also formed into the contact holes to connect with the memory gate electrode 4 and the heavily doped diffusion regions 5, 5.

A film of photosensitive resin (not shown) is then formed over the whole surface of the interconnection material 8 by spin coating. The photosensitive resin is exposed using a prescribed photomask and developed to pattern it to remain on the interconnection formation regions.

Figure 10:
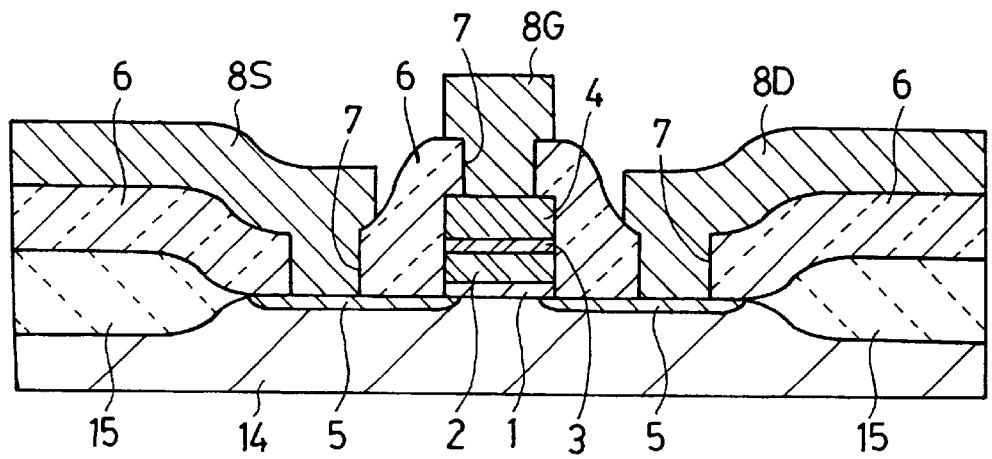

Further, reactive ion etching using boron trichloride ($BCl_3$) and hydrogen bromide (HBr) as reactive gases is effected using the photosensitive resin as an etching mask to plasma-etch the interconnection material 8 and thereby form a gate interconnection electrode 8G, a source interconnection electrode 8S and a drain interconnection electrode 8D that make contact through the contact holes 7 with the exposed regions of the memory gate electrode 4 and the heavily doped diffusion regions 5, 5, respectively, as shown in FIG. 10.

The photosensitive resin used as the etching mask is thereafter removed using nitric acid.

The interconnections 8G, 8S and 8D are then annealed at a temperature around 380° C. in a hydrogen atmosphere.

This annealing of the interconnections is conducted to lower the contact resistance between the interconnections 8S, 8D and the heavily doped diffusion regions 5, 5 and repair pin holes and other defects arising in the interconnection material 8 during deposition by sputtering.

Figure 11:
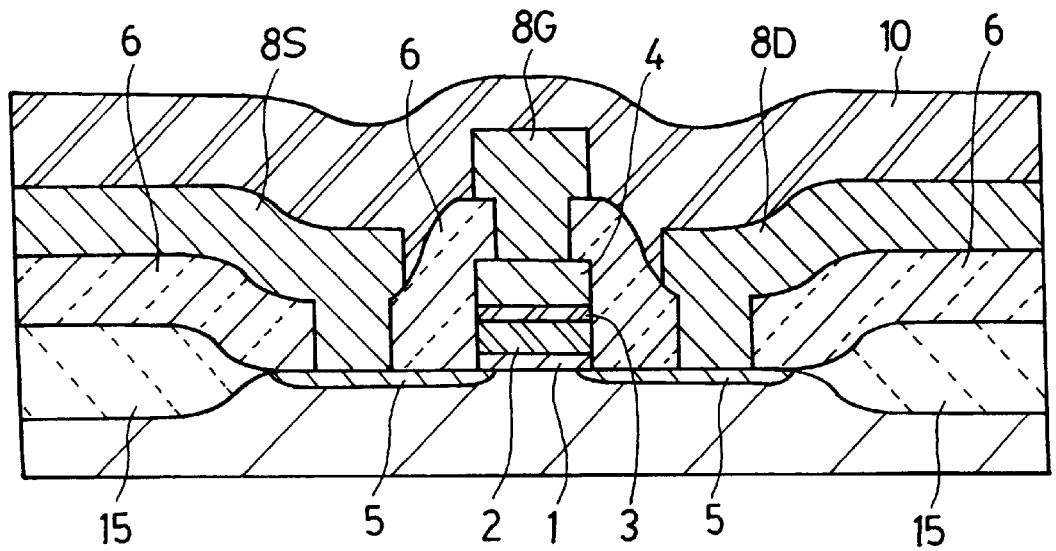

Next, as shown in FIG. 11, the whole surface of the semiconductor substrate 14 is formed with a passivating film 10 composed of a silicon nitride (SiN) film by the plasma chemical vapor deposition process using disilane ($Si_3H_4$) and ammonia ($NH_3$) as reactive gases. The passivating film 10 is formed to a thickness of 800 nm.

A film of photosensitive resin (not shown) is then formed over the whole surface of the passivating film 10 by spin coating. The photosensitive resin is exposed using a prescribed photomask and developed to form openings therein at positions corresponding to the input/output terminals of the interconnections 8G, 8S, 8D.

Figure 12:
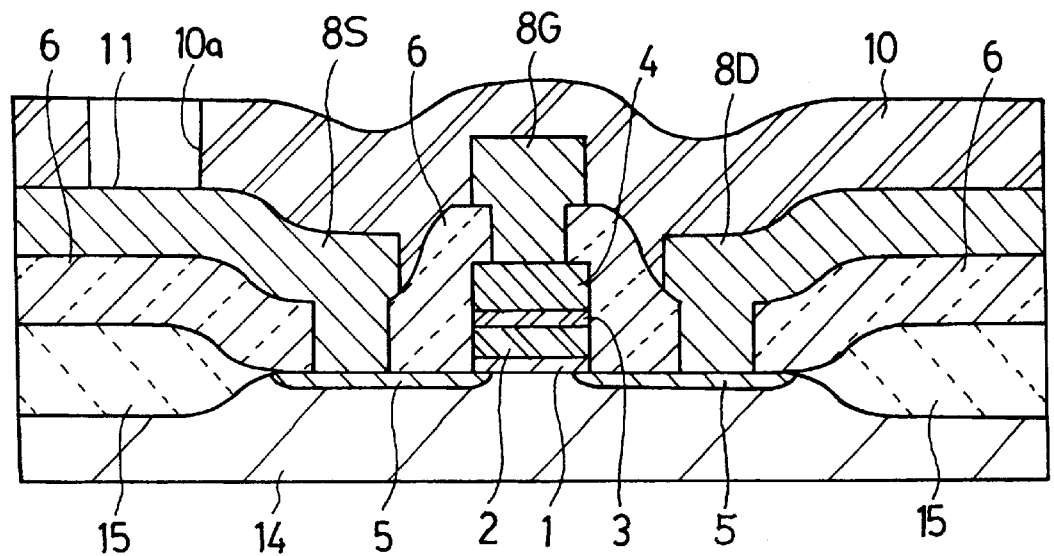

Further, reactive ion etching using carbon tetrafluoride ($CF_4$) and oxygen ($O_2$) as reactive gases is effected using the photosensitive resin as an etching mask to plasma-etch the passivating film 10 and thereby form openings 10a at positions thereof corresponding to the input/output terminal portions 11 of the interconnections 8G, 8S, 8D. The input/output terminal portions 11 are thus exposed as shown in FIG. 12. (Although FIG. 12 shows only the input/output terminal portion 11 of the source interconnection electrode 8S and the associated opening 10a, an input/output terminal portion and an associated opening are also formed at a different sectional portion from that shown in FIG. 12 for each of the gate interconnection electrode 8G and the drain interconnection electrode 8D.)

The photosensitive resin used as the etching mask is then removed using nitric acid.

Finally, the passivating film 10 is annealed at a temperature of 425° C. in a nitrogen atmosphere, thereby completing the semiconductor nonvolatile storage device.

This semiconductor nonvolatile storage device fabrication method enables the damage produced by the plasma of the plasma chemical vapor deposition process during formation of the passivating film 10 and the damage produced by plasma etching of the passivating film 10, which cause electrons or holes to be trapped in the memory gate insulating film 20 (see FIG. 6), to be remedied since it discharges the electrons or holes by annealing the passivating film 10.

Moreover, since the annealing of the passivating film 10 is effected at a higher temperature (about 425° C. in this embodiment) than the annealing of the interconnection material 8 (about 380° C. in this embodiment), the damage arising in the semiconductor nonvolatile storage device during etching of the interconnection material 8 and heretofore impossible to eliminate by later annealing of the interconnections can be remedied.

Since this elimination of damage enables the threshold voltage of the semiconductor nonvolatile storage device to maintain a stable state with no trapped electrons or holes, there can be obtained a semiconductor nonvolatile storage device that is free of both write voltage fluctuation and erase voltage fluctuation.

The annealing of the passivating film is preferably conducted at an upper limit temperature beyond which the interconnection electrodes melt, i.e., a temperature slightly lower than the melting point of the interconnection material.

In the step of forming the memory gate insulating film 20 on the element region of the semiconductor substrate 14 in the foregoing embodiment, the tunnel oxide film 1 is formed as a silicon oxide film.

Instead, however, the tunnel oxide film 1 can be a tunnel nitride-oxide film formed by nitriding a silicon oxide film under annealing at 950° C. in a nitrogen atmosphere. In this case, the memory gate insulating film is formed by sequentially layering the tunnel nitride-oxide film, the silicon nitride film and the top oxide film on the element region of the semiconductor substrate 14. The processes in the ensuing steps are exactly the same as those in the foregoing embodiment.

When a tunnel nitride-oxide film is used in place of a tunnel oxide film, the injection of electrons during data write or the injection of holes during data erase from the semiconductor substrate occurs readily to enable write or erase to be effected at high speed. The effect of speeding up the injection of holes during erase is especially great.

Example of forming a two-layer passivating film: FIGS. 13 to 16

In the foregoing embodiment, the passivating film covering the surface of the semiconductor nonvolatile storage device is a one-layer passivating film composed of a silicon nitride (SiN) film. A two-layer passivating film can be formed instead to further enhance the reliability of the semiconductor nonvolatile storage device.

The passivating film forming steps and the step of forming openings for the input/output terminals in the passivating film in this case will be explained with reference to FIGS. 13 to 16.

Figure 13:
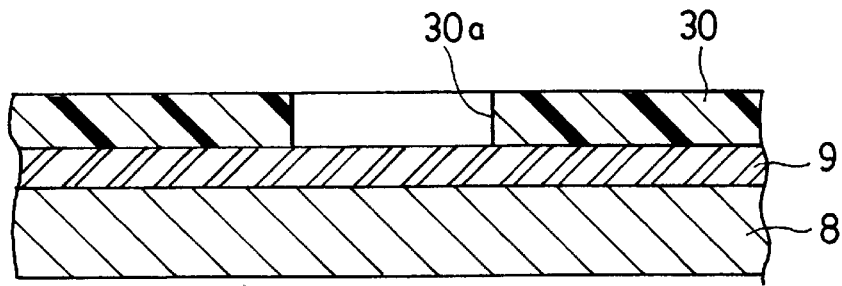
FIGS. 13 to 16 are partial sectional views showing passivating film forming steps in the case of forming a two-layer passivating film in place of the one-layer passivating film of the first embodiment.

After the interconnections 8G, 8S, 8D have been formed as shown in FIG. 10 relating to the earlier embodiment, these interconnections, indicated by their common interconnection material 8 in FIG. 13, are formed over the whole surface of the interconnection material 8 with a first passivating film 9 composed of a silicon oxide film containing phosphorus (PSG), by the plasma chemical vapor deposition process using monosilane ($SiH_4$), phosphine ($PH_3$) and oxygen ($O_2$) as reactive gases. The first passivating film 9 is formed to a thickness of 400 nm.

Next, a film of photosensitive resin 30 is formed over the whole surface of the first passivating film 9 by spin coating. The photosensitive resin is exposed using a prescribed photomask and developed to form openings 30a therein at portions corresponding to the input/output terminals of the interconnection material 8, as shown in FIG. 13.

Figure 14:
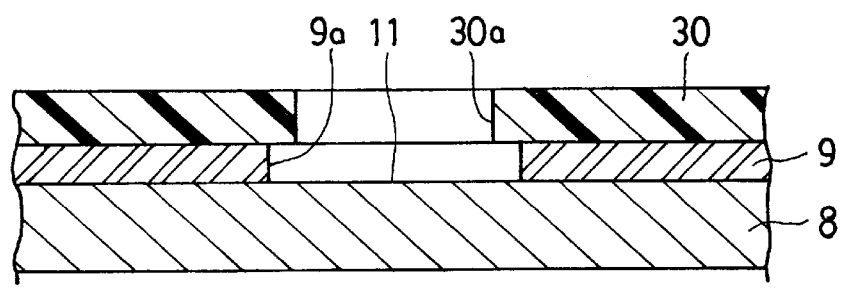

After this, wet etching using acetic acid ($CH_3COOH$) and an aqueous mixed solution of hydrofluoric acid (HF) and ammonium fluoride ($NH_4F$) as etchant is effected using the photosensitive resin 30 as an etching mask to form the first passivating film 9 composed of PSG with openings 9a, as shown in FIG. 14, to enable connection between an external device and the input/output terminal portions 11 of the interconnections.

The etching by this wet etching proceeds isotropically so that the openings 9a are formed not only at the portions of the first passivating film 9 exposed through the photosensitive resin 30 but also somewhat into portions covered by the photosensitive resin 30. In other words, the first passivating film 9 is formed with openings 9a of larger size than the openings in the photosensitive resin 30.

The photosensitive resin 30 used as the etching mask is then removed using nitric acid.

Figure 15:
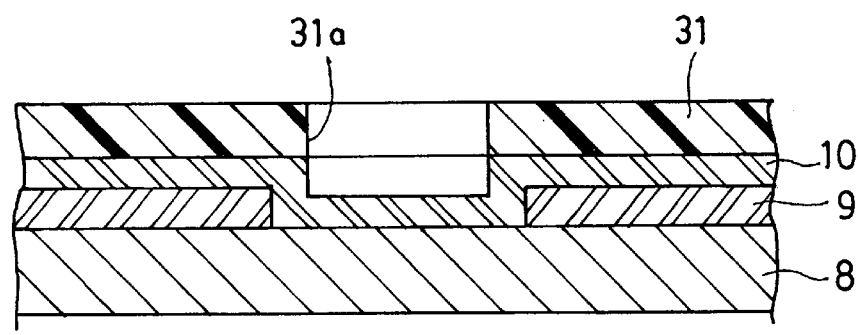

Next, as shown in FIG. 15, all exposed portions of first passivating film 9 and the interconnection material 8 are formed with a second passivating film 10 composed of a silicon nitride (SiN) film by the plasma chemical vapor deposition process using disilane ($Si_3H_4$) and ammonia ($NH_3$) as reactive gases. The second passivating film 10 is formed to a thickness of 400 nm. The second passivating film 10 is formed to coat the inner surrounding surfaces of the openings 9a of the first passivating film 9.

Next a film of photosensitive resin 31 is formed over the whole surface of the second passivating film 10 by spin coating. The photosensitive resin is exposed using the same photomask as used to pattern the photosensitive resin 30 shown in FIG. 13 and developed to form openings 31 a therein at portions corresponding to the input/output terminals of the interconnection material 8, as shown in FIG. 15.

Figure 16:
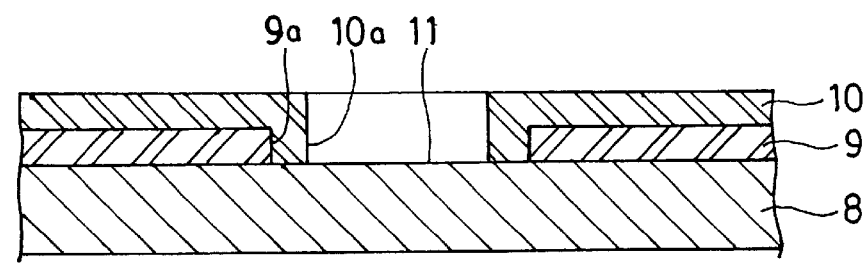

Further, reactive ion etching using carbon tetrafluoride ($CF_4$) and oxygen ($O_2$) as reactive gases is effected using the photosensitive resin 31 as an etching mask to plasma-etch the second passivating film 10 and thereby to form openings 10a, as shown in FIG. 16, to enable connection between an external device and the input/output terminal portions 11 of the interconnections. The portions of the inner surrounding surfaces of the opening 9a of the first passivating film 9 covered by the second passivating film 10 remain unremoved by the etching at this time because they are covered by the photosensitive resin 31.

The photosensitive resin 31 used as the etching mask is then removed using nitric acid.

By forming the openings 9a in the first passivating film 9 by wet etching and the openings 10a in the second passivating film 10 by dry etching in this way, the patterning of the photosensitive resin used as the etching masks can be effected using the same photomask and the inner surrounding surfaces of the openings 9a of the first passivating film 9 can be coated by the second passivating film 10.

The first passivating film 9 composed of PSG serves to relax the stress of the second passivating film 10 composed of SiN but is moisture absorptive. The reliability of the semiconductor nonvolatile storage device is therefore enhanced by completely coating the first passivating film 9 with the second passivating film 10.

Alternatively, however, and without any problem regarding device characteristics, it is possible to form the openings for the input/output terminal portions 11 by a single dry etching step conducted after forming the two-layer passivating film 9, 10.

Second embodiment: FIGS. 17 to 22

A method of fabricating a semiconductor nonvolatile storage device that is a second embodiment of the invention will now be explained with reference to FIGS. 17 to 22.

Figure 17:
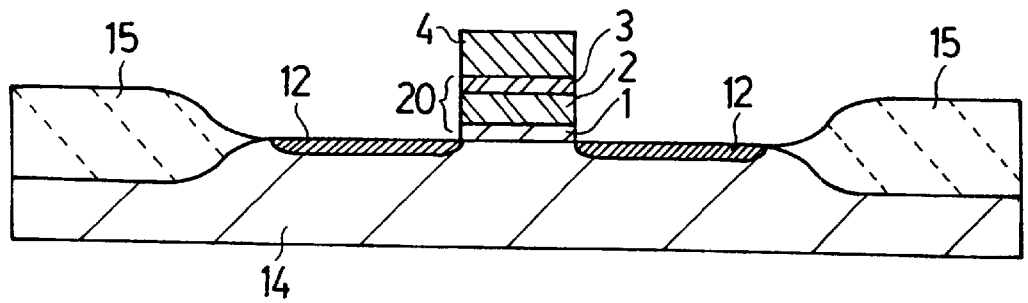
FIGS. 17 to 22 are schematic sectional views illustrating a method of fabricating a semiconductor nonvolatile storage device that is a second embodiment of the invention in the order of its steps.

FIGS. 17 to 22 are schematic sectional views illustrating the method of fabricating a semiconductor nonvolatile storage device in the order of its steps. The steps prior to the point illustrated in FIG. 17 are not shown in the drawings, however, because they are the same as those of the first embodiment.

Specifically, referring to FIG. 17, the step of forming the element region on the P-conductivity-type semiconductor (silicon) substrate 14 and the isolation region 15 composed of a silicon oxide film to surround the element region, the step of forming a memory gate insulation film 20 by sequentially layering the tunnel oxide film 1, the silicon nitride film 2 and the top oxide film 3 on the element region, and the step of forming a memory gate electrode 4 composed of a polycrystalline silicon film on the memory gate insulation film 20 are exactly the same as the steps of the first embodiment explained with reference to FIGS. 1 to 6.

After the memory gate electrode 4 has been formed at the central portion of the element region on the semiconductor substrate 14 with the memory gate insulating film 20 disposed between itself and the semiconductor substrate 14, as shown in FIG. 17, lightly doped diffusion regions 12, 12 are formed in the semiconductor substrate 14 at regions self-aligned with the opposite sides of the memory gate electrode 4 and the element isolation regions 15, 15 by implanting ions of phosphor, an impurity of N-type conductivity, under conditions of an acceleration energy of 25 keV and an ion implantation dose of $1.5 \times 10^{13}$ atoms/$cm^2$.

Figure 18:
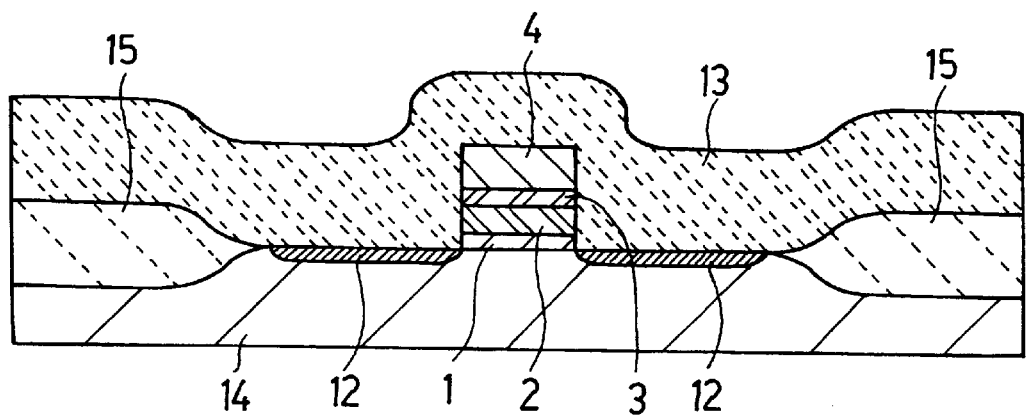

Then, as shown in FIG. 18, an insulating film 13 composed of PSG, i.e., a silicon oxide film containing phosphorus, is formed over the whole surface of the semiconductor substrate 14 by the chemical vapor deposition process using monosilane ($SiH_4$) and phosphine ($PH_3$) as reaction gases. The insulating film 13 is formed to a thickness of 400 nm.

Next, reactive ion etching using trifluoromethane ($CHF_3$) and difluoromethane ($CH_2F_2$) as reactive gases is effected from above in FIG. 18. This etches and removes most of the PSG insulating film 13. However, owing to the thickness variation of the insulating film 13, it results in the formation of sidewall insulating films 33, 33 composed of PSG on opposite side surfaces of the memory gate electrode 4 and the memory gate insulating film 20, as shown in FIG. 19.

Figure 19:
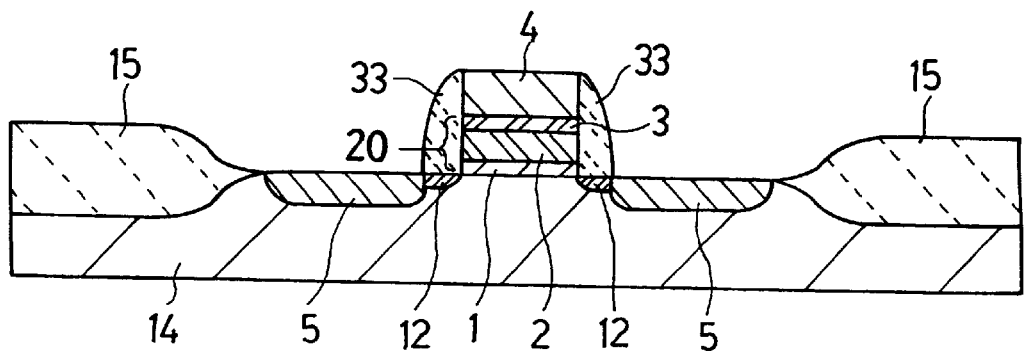

Next, ions of phosphor, an impurity of N-type conductivity, are implanted under conditions of an acceleration energy of 50 keV and an ion implantation dose of $3.5 \times 10^{11}$ atoms/$cm^2$ to form heavily doped diffusion regions 5, 5 at those portions of the lightly doped diffusion regions 12, 12 of the semiconductor substrate 14 not covered by the sidewall insulating films 33, 33 on the opposite side surfaces of the memory gate electrode 4 and the memory gate insulating film 20, as shown in FIG. 19. The lightly doped diffusion regions 12, 12 therefore remain only at the portions covered by the pair of sidewall insulating films 33, 33.

Figure 20:
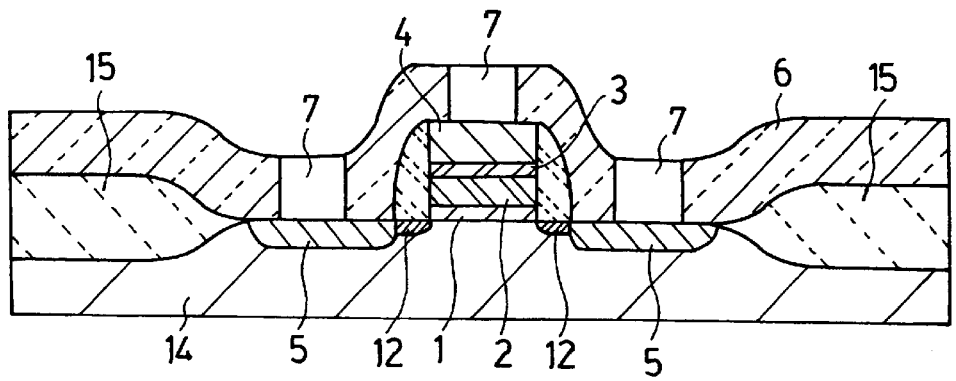

After this, as shown in FIG. 20, the interlayer insulator 6 composed of BPSG, i.e., a silicon oxide film containing phosphorus and boron, is formed over the whole surface of the semiconductor substrate 14 by the chemical vapor deposition process using monosilane ($SiH_4$), phosphine ($PH_3$) and diborane ($B_2H_6$) as reaction gases. The interlayer insulator 6 is formed to a thickness of 550 nm.

Further, annealing is conducted at a temperature of 900° C. for 30 minutes in a nitrogen atmosphere to effect so-called reflow by causing viscous flow of the BPSG interlayer insulator 6, thereby flattening the interlayer insulator 6.

Next, a film of photosensitive resin (not shown) is formed over the whole surface of the interlayer insulator 6 by spin coating. The photosensitive resin is exposed using a prescribed photomask and developed to pattern it so as to remain on the interlayer insulator 6 at portions other than contact hole formation regions.

After this, reactive ion etching using difluoromethane ($CH_2F_2$) and trifluoromethane ($CHF_3$) as reactive gases is effected using the photosensitive resin 26 as an etching mask to open contact holes 7 in the interlayer insulator 6.

The photosensitive resin used as the etching mask is then removed using hot sulfuric acid heated to 150° C. The result is shown in FIG. 20.

Next an interconnection material composed of aluminum is formed on the interlayer insulator 6 and within the contact holes 7 to a thickness of 1 μm by sputtering. The interconnection material connects with the memory gate electrode 4 and the heavily doped diffusion regions 5, 5 through the contact holes 7.

A film of photosensitive resin (not shown) is then formed over the whole surface of the interconnection material by spin coating. The photosensitive resin is exposed using a prescribed photomask and developed to pattern it to remain on the interconnection formation regions.

Figure 21:
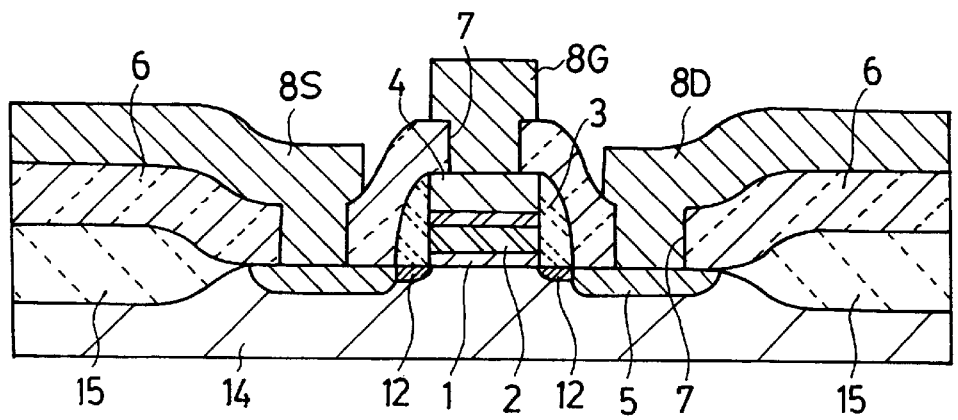

Further, reactive ion etching using boron trichloride ($BCl_3$) and hydrogen bromide (HBr) as reactive gases is effected using the photosensitive resin as an etching mask to pattern the interconnection material 8. This forms a gate interconnection electrode 8G, a source interconnection electrode 8S and a drain interconnection electrode 8D that make contact with the memory gate electrode 4 and the heavily doped diffusion regions 5, 5. The result is shown in FIG. 21.

The photosensitive resin used as the etching mask is thereafter removed using nitric acid.

Next, the interconnections are then annealed at a temperature around 380° C. in a hydrogen atmosphere.

This annealing of the interconnections is conducted to lower the contact resistance between the interconnections 8S, 8D and the heavily doped diffusion regions 5, 5 and repair pin holes and other defects arising in the interconnection material during deposition on the interlayer insulator by sputtering.

Figure 22:
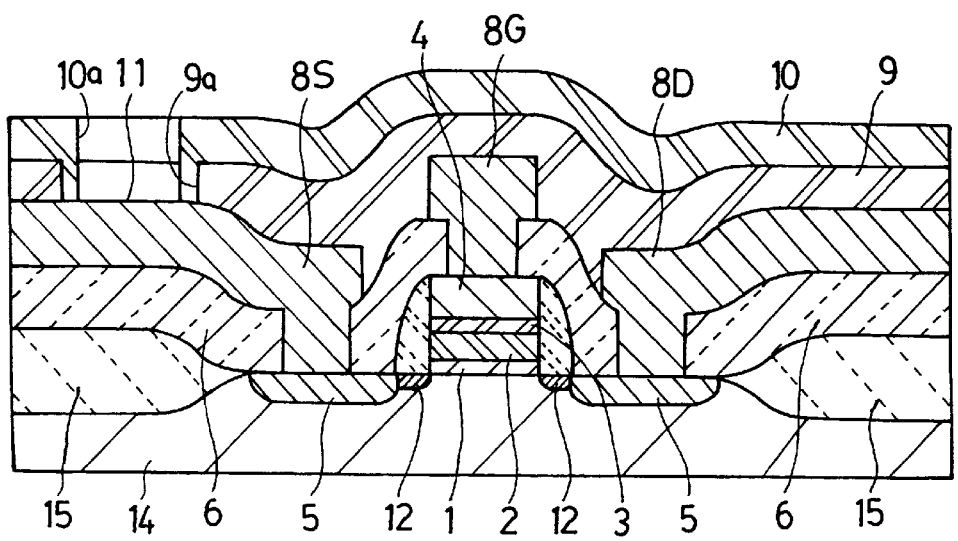
Figure 23:
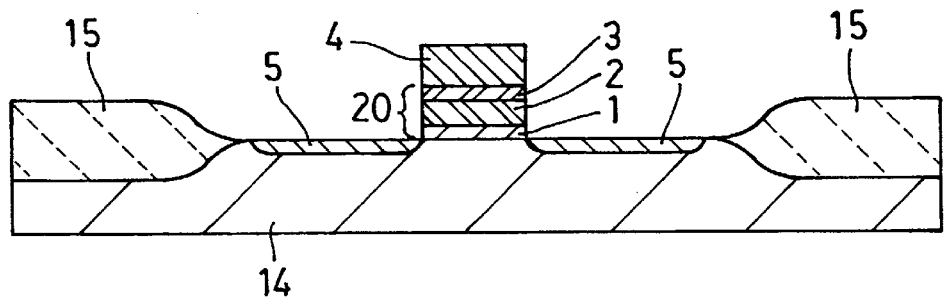
FIG. 23 to 25 are schematic sectional views illustrating the main steps of a conventional method of fabricating a semiconductor nonvolatile storage device.
Figure 24:
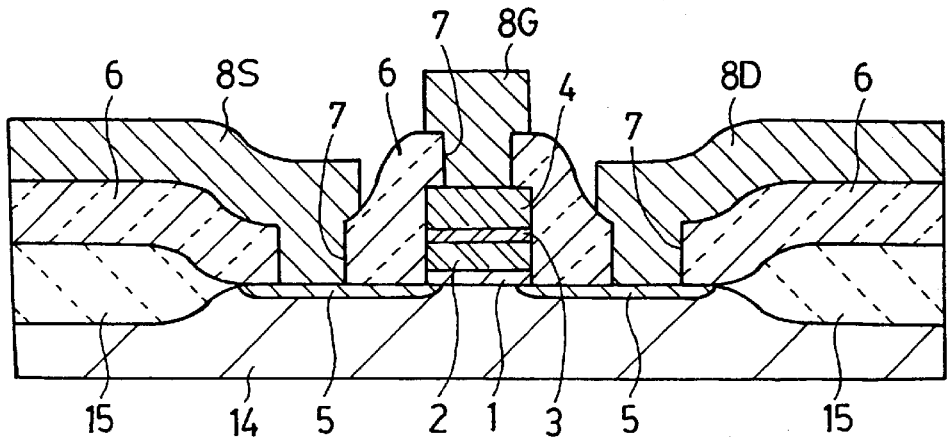
Figure 25:
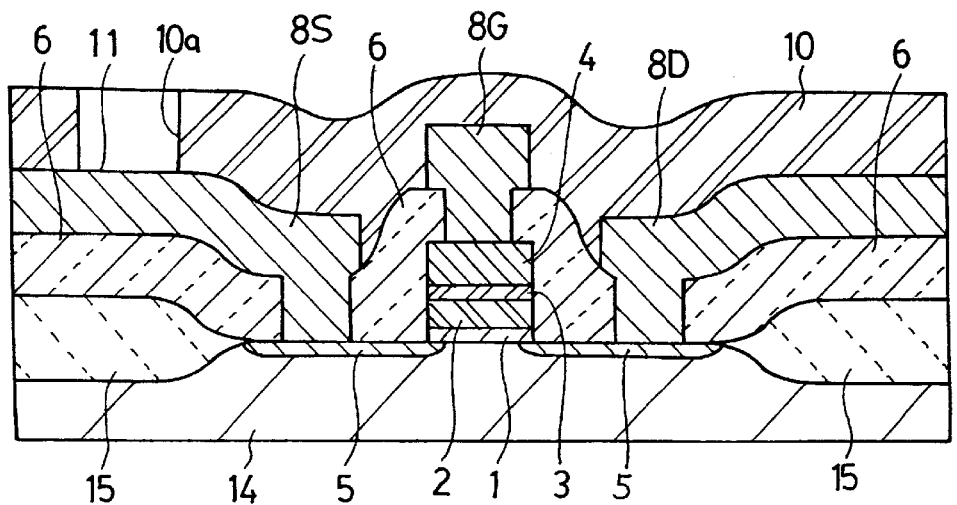

Next, a first passivating film 9 composed of a silicon oxide film containing phosphorus (PSG) is formed over the whole surface of the semiconductor substrate 14, as shown in FIG. 22, by the chemical vapor deposition process using monosilane ($SiH_4$), phosphine ($PH_3$) and oxygen ($O_2$) as reactive gases. The first passivating film 9 is formed to a thickness of 400 nm.

A film of photosensitive resin (not shown) is then formed over the whole surface of the first passivating film 9 by spin coating. The photosensitive resin is patterned by exposure through a prescribed photomask and development.

After this, wet etching using acetic acid ($CH_3COOH$) and an aqueous mixed solution of hydrofluoric acid (HS) and ammonium fluoride ($NH_4F$) as etchant is effected using the photosensitive resin as an etching mask to etch the first passivating film 9 composed of PSG and thereby form openings 9a to expose the input/output terminal portions 11 for connection with the an external device and the interconnections 8G, 8S, 8D. The photosensitive resin used as the etching mask is then removed by immersion in nitric acid.

Next, a second passivating film 10 composed of a silicon nitride (SiN) film is formed over the whole surface of the first passivating film 9 by the plasma chemical vapor deposition process using disilane ($Si_3H_4$) and ammonia ($NH_3$) as reactive gases. The second passivating film 10 is formed to a thickness of 400 nm.

A film of photosensitive resin (not shown) is then formed over the whole surface of the second passivating film 10 by spin coating. The photosensitive resin is patterned by exposure through a prescribed photomask and development.

Next, reactive ion etching using carbon tetrafluoride ($CF_4$) and oxygen ($O_2$) as reactive gases is effected using the photosensitive resin as an etching mask to plasma-etch the second passivating film 10 composed of SiN. This forms openings 10a to expose the input/output terminal portions 11 for connection with an external device and the interconnections 8G, 8S, 8D. The photosensitive resin used as the etching mask is then removed using nitric acid.

Here again, by forming the opening 9a in the first passivating film 9 by wet etching and the openings 10a in the second passivating film 10 by dry etching, the patterning of the photosensitive resin used as the etching masks can be effected using the same photomask and the inner surrounding surfaces of the openings 9a of the first passivating film 9 can be coated by the second passivating film 10. Since this results in the first passivating film, composed of moisture-absorptive PSG, being completely coated with the second passivating film 10 composed of SiN, the reliability of the semiconductor nonvolatile storage device is enhanced.

Alternatively, however, it is possible to form the openings for the input/output terminal portions 11 by a single dry etching step conducted after forming the two-layer passivating film 9, 10 or, as shown in FIG. 12 relating to the first embodiment, to form only a one-layer passivating film made of SiN, like the passivating film 10, to a thickness of 800 nm.

After the first and second passivating films 9, 10 have been formed and provided with the openings 9a, 10a for the input/output terminal portions 11, the passivating film 10 is annealed at a temperature of 425° C. in a nitrogen atmosphere.

The damage produced by the plasma of the plasma chemical vapor deposition process during formation of the second passivating film 10 and the damage produced by plasma etching of the second passivating film 10, which cause electrons or holes to be trapped in the memory gate insulating film 20 of the semiconductor nonvolatile storage device (see FIG. 17), is remedied by this annealing since it discharges the electrons or holes.

Moreover, since the annealing of the second passivating film 10 is effected at a higher temperature than the annealing of the interconnection material, the damage arising in the semiconductor nonvolatile storage device during etching of the interconnection material and heretofore impossible to eliminate by later annealing of the interconnections can be remedied.

Since this elimination of damage enables the threshold voltage of the semiconductor nonvolatile storage device to maintain a stable state with no trapped electrons or holes, there can be obtained a semiconductor nonvolatile storage device that is free of both write voltage fluctuation and erase voltage fluctuation.

The annealing of the passivating film is preferably conducted at an upper limit temperature beyond which the interconnection electrodes melt, i.e., a temperature slightly lower than the melting point of the interconnection material. In this second embodiment, the passivating film is annealed at about 425° C. in a nitrogen atmosphere.

Moreover, in this second embodiment, the presence of the lightly doped diffusion regions 12, 12 formed between the opposite sides of the memory gate electrode 4 (under the sidewall insulating films 33, 33) and the heavily doped diffusion regions 5, 5 prevents interchannel current leakage and increases the breakdown voltage (drain breakdown voltage), thereby elevating the maximum operating voltage.

This is particularly advantageous in the case of a semiconductor nonvolatile storage device having a large channel length (distance between the heavily doped diffusion regions 5, 5).

In the second embodiment, the tunnel oxide film 1 constituting the lowermost layer of the memory gate insulating film of the semiconductor nonvolatile storage device is again formed as a silicon oxide film. Instead, however, it can be a tunnel nitride-oxide film formed by nitriding a silicon oxide film at 950° C.

As explained in the foregoing, the method of fabricating a semiconductor nonvolatile storage device according to this invention discharges electrons or holes trapped in the memory gate insulation film of a semiconductor nonvolatile storage device of MONOS structure by effecting high-temperature annealing after formation of the passivating film, thereby enabling recovery from the damage caused by the trapping of the electrons or holes. It is therefore possible to provide a semiconductor nonvolatile storage device that is free of threshold voltage fluctuation and can operate stably.

What is claimed is:

1. A method of fabricating a semiconductor nonvolatile storage device comprising the steps of:

forming an element region and an element isolation region on a semiconductor substrate;

forming a memory gate insulation film by sequentially layering a tunnel oxide film, a silicon nitride film and a top oxide film on the element region of the semiconductor substrate;

forming a memory gate electrode on the memory gate insulation film;

forming heavily doped diffusion regions at element region portions of the semiconductor substrate self-aligned on opposite sides of the memory gate electrode;

forming an interlayer insulator over the whole surface of the semiconductor substrate including the memory gate electrode;

forming contact holes in the interlayer insulator at positions thereof corresponding to the memory gate electrode and the heavily doped diffusion regions;

forming interconnection electrodes passing through the contact holes and connecting with the memory gate electrode and the heavily doped diffusion regions;

forming a passivating film over the whole surface of the semiconductor substrate including the interconnection electrodes by a plasma chemical vapor deposition process;

forming openings for input/output terminals in the passivating film at positions thereof corresponding to the memory gate electrode and the heavily doped diffusion regions by plasma etching;

annealing the passivating film; and annealing the interconnection electrodes following the step of forming interconnection electrodes, and said annealing the passivating film is conducted at a higher temperature than the annealing temperature in the interconnection electrodes annealing.

2. A method of fabricating a semiconductor nonvolatile storage device according to claim 1 wherein said memory gate insulation film is formed in the step of forming the memory gate insulation film on the element region of the semiconductor substrate by sequentially layering a tunnel nitride-oxide film, a silicon nitride film and a top oxide film.

3. A method of fabricating a semiconductor nonvolatile storage device according to claim 1 wherein said annealing the passivating film is conducted at a temperature slightly lower than a melting point of an interconnection material.

4. A method of fabricating a semiconductor nonvolatile storage device according to claim 1 which further comprises a step of annealing the interconnection electrodes at about 380° C. in a hydrogen atmosphere following the interconnection electrode forming step, and said annealing the passivating film is conducted at about 425° C. in a nitrogen atmosphere.

5. A method of fabricating a semiconductor nonvolatile storage device according to claim 2 wherein said annealing the passivating film is conducted at a temperature slightly lower than a melting point of an interconnection material.

6. A method of fabricating a semiconductor nonvolatile storage device according to claim 2 which further comprises a step of annealing the interconnection electrodes at about 380° C. in a hydrogen atmosphere following the step of forming interconnection electrodes, and said annealing the passivating film is conducted at about 425° C. in a nitrogen atmosphere.

7. A method of fabricating a semiconductor nonvolatile storage device comprising the step of:

forming an element region and an element isolation region on a semiconductor substrate;

forming a memory gate insulation film by sequentially layering a tunnel oxide film, a silicon nitride film and a top oxide film on the element region of the semiconductor substrate;

forming a memory gate electrode on the memory gate insulation film;

forming lightly doped diffusion regions at element region portions of the semiconductor substrate self-aligned on opposite sides of the memory gate electrode;

forming sidewall insulating films on opposite side surfaces of the memory gate electrode and the memory gate insulation film;

forming heavily doped diffusion regions in the lightly doped diffusion regions of the semiconductor substrate other than the portions covered by the sidewall insulating films of the opposite side surfaces;

forming an interlayer insulator over the whole surface of the semiconductor substrate including the memory gate electrode;

forming contact holes in the interlayer insulator at positions thereof corresponding to the memory gate electrode and the heavily doped diffusion regions;

forming interconnection electrodes passing through the contact holes and connecting with the memory gate electrode and the heavily doped diffusion regions;

forming a passivating film over the whole surface of the semiconductor substrate including the interconnection electrodes by a plasma chemical vapor deposition process;

forming openings for input/output terminals in the passivating film at positions thereof corresponding to the memory gate electrode and the heavily doped diffusion regions by plasma etching;

annealing the passivating film; and annealing the interconnection electrodes following the step of forming interconnection electrodes, and said annealing the passivating film is conducted at a higher temperature than the annealing temperature in the interconnection electrodes annealing.

8. A method of fabricating a semiconductor nonvolatile storage device according to claim 7 wherein said memory gate insulation film is formed in the step of forming the memory gate insulation film on the element region of the semiconductor substrate by sequentially layering a tunnel nitride-oxide film, a silicon nitride film and a top oxide film.

9. A method of fabricating a semiconductor nonvolatile storage device according to claim 7 wherein said annealing the passivating film is conducted at a temperature slightly lower than a melting point of an interconnection material.

10. A method of fabricating a semiconductor nonvolatile storage device according to claim 7 which further comprises a step of annealing the interconnection electrodes at about 380° C. in a hydrogen atmosphere following the step of forming interconnection electrodes, and said annealing the passivating film is conducted at about 425° C. in a nitrogen atmosphere.

11. A method of fabricating a semiconductor nonvolatile storage device according to claim 8 wherein said annealing the passivating film is conducted at a temperature slightly lower than a melting point of an interconnection material.

12. A method of fabricating a semiconductor nonvolatile storage device according to claim 8 which further comprises a step of annealing the interconnection electrodes following the step of forming interconnection electrodes, and said annealing the passivating film is conducted at a higher temperature than the annealing temperature in the interconnection electrode annealing.

13. A method of fabricating a semiconductor nonvolatile storage device according to claim 8 which further comprises a step of annealing the interconnection electrodes at about 380° C. in a hydrogen atmosphere following the step of forming interconnection electrodes, and said annealing the passivating film is conducted at about 425° C. in a nitrogen atmosphere.

14. A method of fabricating a semiconductor nonvolatile storage device according to claim 1 wherein said passivating film forming step includes a step of forming a first passivating film composed of a silicon oxide film containing phosphorus over the whole surface of the semiconductor substrate including the interconnection electrodes and a step of forming a second passivating film composed of a silicon nitride film on the first passivating film.

15. A method of fabricating a semiconductor nonvolatile storage device according to claim 14 wherein in the step of forming openings for input/output terminals in the passivating film, openings are formed whose inner surrounding surfaces of the opening in the first passivating film are coated with the second passivating film.

16. A method of fabricating a semiconductor nonvolatile storage device according to claim 7 wherein said passivating film forming step includes a step of forming a first passivating film composed of a silicon oxide film containing phosphorus over the whole surface of the semiconductor substrate including the interconnection electrodes and a step of forming a second passivating film composed of a silicon nitride film on the first passivating film.

17. A method of fabricating a semiconductor nonvolatile storage device according to claim 16 wherein in the step of forming openings for input/output terminals in the passivating film, openings are formed whose inner surrounding surfaces of the opening in the first passivating film are coated with the second passivating film.

* * * * *

UNITED STATES PATENT AND TRADEMARK OFFICE
CERTIFICATE OF CORRECTION

PATENT NO. : 6,103,572
DATED : August 15, 2000
INVENTOR(S) : Kirihara et al.

It is certified that error appears in the above-identified patent and that said Letters Patent is hereby corrected as shown below:

Column 3,
Line 57, change "C." to be -- C --
Line 59, change "C." to be -- C --

Column 5,
Line 27, change "C." to be -- C --
Line 30, change "C." to be -- C --
Line 48, change "C." to be -- C --
Line 55, change "C." to be -- C --

Column 6,
Line 50, change "C." to be -- C --

Column 7,
Line 33, change "C." to be -- C --

Column 8,
Line 13, change "C." to be -- C --
Line 37, change "C." to be -- C --

UNITED STATES PATENT AND TRADEMARK OFFICE
CERTIFICATE OF CORRECTION

PATENT NO. : 6,103,572
DATED : August 15, 2000
INVENTOR(S) : Kirihara et al.

It is certified that error appears in the above-identified patent and that said Letters Patent is hereby corrected as shown below:

Column 11,
Line 9, change "C." to be -- C --
Line 50, change "C." to be -- C --

Signed and Sealed this

Thirteenth Day of November, 2001

Attest:

*Nicholas P. Godici*

NICHOLAS P. GODICI
*Acting Director of the United States Patent and Trademark Office*

*Attesting Officer*